(12) United States Patent
Huang et al.

(10) Patent No.: US 7,379,170 B2
(45) Date of Patent: May 27, 2008

(54) APPARATUS AND METHOD FOR CHARACTERIZING AN IMAGE SYSTEM IN LITHOGRAPHY PROJECTION TOOL

(75) Inventors: Hsu-Ting Huang, San Jose, CA (US); Abdurrahman Sezginer, Los Gatos, CA (US)

(73) Assignee: Invarium, Inc., San Jose, CA (US)

( * ) Notice: Subject to any disclaimer, the term of this patent is extended or adjusted under 35 U.S.C. 154(b) by 160 days.

(21) Appl. No.: 11/203,331

(22) Filed: Aug. 13, 2005

(65) Prior Publication Data

US 2006/0251994 A1 Nov. 9, 2006

Related U.S. Application Data

(60) Provisional application No. 60/677,104, filed on May 2, 2005.

(51) Int. Cl.
*G01B 9/00* (2006.01)

(52) U.S. Cl. .......................... 356/124; 430/311; 430/5; 356/124.5

(58) Field of Classification Search ............... 356/124, 356/124.5
See application file for complete search history.

(56) References Cited

U.S. PATENT DOCUMENTS

| | | | |
|---|---|---|---|
| 4,110,046 A * | 8/1978 | Baker et al. ................. 356/124 |
| 5,978,085 A | 11/1999 | Smith et al. |
| 6,011,611 A | 1/2000 | Nomura et al. |
| 6,130,747 A | 10/2000 | Nomura et al. |
| 6,314,212 B1 * | 11/2001 | Womack et al. ............. 382/286 |
| 6,317,198 B1 | 11/2001 | Sato et al. |
| 6,356,345 B1 | 3/2002 | McArthur et al. |
| 6,573,986 B2 | 6/2003 | Smith et al. |
| 6,650,399 B2 | 11/2003 | Baselmans et al. |
| 6,674,511 B2 | 1/2004 | Nomura et al. |
| 6,693,704 B1 * | 2/2004 | Ooki et al. ................. 356/121 |
| 6,741,327 B2 | 5/2004 | Nomura et al. |
| 2002/0062206 A1 * | 5/2002 | Liebchen ....................... 703/6 |
| 2003/0006212 A1 * | 1/2003 | Segawa et al. ............... 216/12 |
| 2004/0184030 A1 * | 9/2004 | Liebchen .................... 356/124 |
| 2004/0224242 A1 * | 11/2004 | Izuha et al. .................... 430/5 |
| 2006/0073686 A1 | 4/2006 | Zach et al. |

OTHER PUBLICATIONS

Sung, Jinwon, Mahesh Pitchumani, and Eric Johnson, "Aberration measurement of photolithographic lenses by use of hybrid diffractive photomasks," Applied Optics, vol. 42, No. 11, Apr. 10, 2003.*

Ward, A.J., Robbins, Reid, Whitbread, Busico, Williams, Duck, Childs, Carter, "Realization of Phase Grating Comb Reflectors and Their Application to Widely Tunable DBR Lasers," IEEE Photonics Technology Letters, vol. 16, No. 11, Nov. 2004.*

(Continued)

*Primary Examiner*—Gregory J. Toatley, Jr.
*Assistant Examiner*—Rebecca C Slomski
(74) *Attorney, Agent, or Firm*—Sheppard Mullin Richter & Hampton LLP (57) ABSTRACT

A system and method for characterizing an imaging system causes a diffraction image indicative of a test structure having a generalized line-grating to be formed and then extracts from a measurement of the diffraction image a lens transmittance function, a photoresist property or a defocus distance.

31 Claims, 9 Drawing Sheets

OTHER PUBLICATIONS

N. R. Farrar, et al., "In-situ measurement of lens aberrations," (SPIE, vol. 4000, p. 18, 2000).

M. V. D. Kerkhof, et al., "Full optical column characterization of DUV lithographic projection tools," (SPIE, vol. 5377, pp. 1960-1970, 2004).

P. E. Dirksen, et al., "Aberration retrieval using the extended Nijboer-Zernike approach," J. Microlith. Microfab., Microsyst., vol. 2, p. 61, 2003.

P. Dirksen, et al., "Novel aberration monitor for optical lithography," SPIE, vol. 3679, pp. 77-86, 1999.

* cited by examiner

APPARATUS AND METHOD FOR CHARACTERIZING AN IMAGE SYSTEM IN LITHOGRAPHY PROJECTION TOOL

RELATED APPLICATIONS

This application is a continuation-in-part of U.S. patent application Ser. No. 60/677,104, entitled "Apparatus and Method for Characterizing An Imaging System in Projection Lithography", filed May 2, 2005, and is related to U.S. utility patent application Ser. No. 11/203,329, entitled "Apparatus and Method for Compensating a Lithography Projection Tool", disclosure ID-038, filed Aug. 13, 2005, which related application is incorporated herein by reference as though fully set forth and which application is also a continuation-in-part applications of U.S. patent application Ser. No. 60/677,104. This application is further related to U.S. patent application Ser. No. 11/203,505, disclosure ID-021, Ser. No. 11/203,498, disclosure ID-025, Ser. No. 11/203,522, disclosure ID-030, and Ser. No. 11/203,330, disclosure ID-039, all of which applications are filed concurrently with this application on Aug. 13, 2005, and which applications are incorporated herein by reference as though fully set forth. Elements of the inventions disclosed in these six patent applications can be used separately or in combination with each other.

BACKGROUND

There have been different kinds of systems and methods related to the measurement of wave front aberrations and other imperfections in imaging system of a projection lithography tool. Nevertheless, there is a need for a convenient and improved method to characterize the imperfections of an imaging system in a projection lithography tool.

BRIEF SUMMARY OF THE INVENTION

The present invention provides a system and method for characterizing an imaging system. A test pattern having a generalized grating, placed on a photomask, is imaged by the imaging system under test. Some aspects of the image are measured. The measurements are used to obtain a transmittance function that characterizes the projection lens of the imaging system.

BRIEF DESCRIPTION OF THE DRAWINGS

The above mentioned features and steps of the invention and the manner of attaining them will become apparent, and the invention itself will be best understood by reference to the following description of the preferred embodiment(s) of the invention in conjunction with the accompanying drawings wherein.

DETAILED DESCRIPTION OF THE PREFERRED EMBODIMENTS

A method and apparatus for characterizing an imaging system in a lithography projection tool is disclosed. The following description is presented to enable any person skilled in the art to make and use the invention. For purposes of explanation, specific nomenclature is set forth to provide a thorough understanding of the present invention. Descriptions of specific applications and methods are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and steps disclosed herein.

To begin, it should be understood by those skilled in the art that the imperfection of an imaging system in projection lithography is becoming more and more important as the lithographic pattern dimensions continue shrinking. In this regard, an imperfect imaging system in the exposure tool would significantly deteriorate the control of critical dimension in a chip and its uniformity across the chip.

Figure 1:
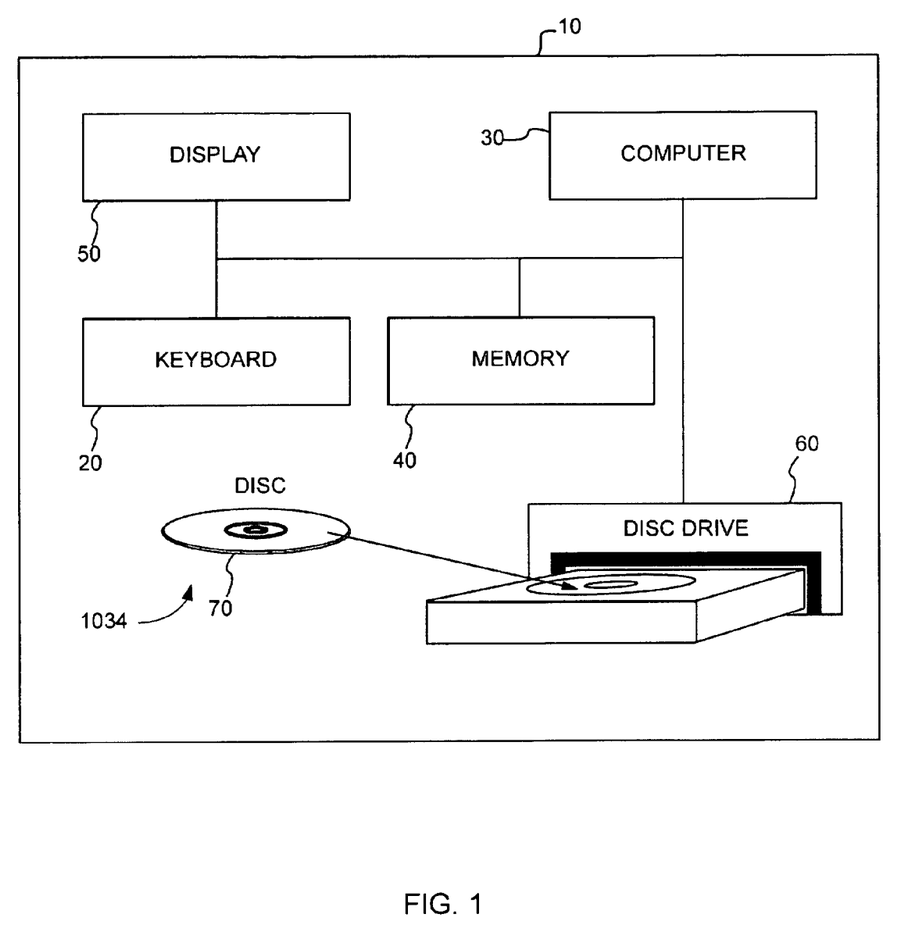
FIG. 1 is a block diagram of a characterizing apparatus, which is constructed in accordance with a preferred embodiment of the present invention.

Referring now to the drawings and the detailed description that follows, there is illustrated in FIG. 1, a characterizing apparatus 10, which provides a unique method of characterizing an imaging system in lithography projection tool. In one preferred embodiment of the present invention a method 1034 to characterize the imperfections of an imaging system in a projection lithography tool is provided. As will be explained hereinafter in greater detail, the method 1034 to characterize the imperfections of an imaging system in a projection lithography tool is provided on a computer program product 70, which is a computer usable medium that has encoded thereon computer readable codes. The computer readable codes enable a user, via the apparatus 10, to apply the method 1034 of characterizing the imperfections of an imaging system in a projection lithography tool. In this regard, the computer readable code causes the apparatus 10 to take actions 4 and 5 below. Actions 1-3 typically require human actions which can be guided and advised by the computer readable code 1034:

1. provide a photomask data set indicative of a test structure with a generalized grating;

2. form an image an of the test structure through the imaging system under test;

3. record the image either using a photodetector or a photoresist. In the case of a photoresist, further record the image of the photoresist by electron microscopy;

4. process the recorded image and measure aspects of the image;

5. estimate a complex lens transmittance function by regression from the measured aspects.

For the purpose of measuring the amplitude of a lens transmittance function, a first generalized line-grating is utilized. In this regard, the first generalized line-grating generally comprises a plurality of parallel lines and spaces arranged such that either at least two lines have different line widths or at least two line spacings have different widths. The first generalized line grating includes:

1. A chirp line grating having at least 3 lines and 2 spaces, wherein the reciprocal of the pitches (reciprocal of the sum of the widths of a line and a space adjacent to the line) are evenly distributed (but not necessary to be monotonically increasing or decreasing) in a spatial frequency domain. Preferably, a chirp line grating has at least 4 lines and 3 spaces, and most preferably at least 5 lines and 4 spaces.

As will be explained hereinafter in greater detail, measuring both amplitude and phase of a lens transmittance function using such generalized line gratings as described above is unique and novel.

For the purpose of measuring the phase of the lens transmittance function, without measuring the amplitude, a second generalized line-grating is utilized. In this regard, the second generalized line-grating generally comprises a plurality of lines (with a minimum of three line) and spaces arranged such that either at least three lines have different line widths or at least three spacings have different widths. A two-dimensional generalized grating is a grating with a pattern which is the intersection of one generalized line-grating with another generalized line-grating, where the generalized line-gratings are not parallel to each other.

More particularly, as will be explained hereinafter in greater detail, the apparatus 10 is utilized to characterize the imperfection of the imaging system in a projection lithography tool. The method implemented by the apparatus 10 uses line/space test structures with varying period (chirped structures) on a test mask. Aerial images of the test structures are formed and recorded on a photosensitive layer on a substrate or in the alternative on an image detector. Imperfections of the projection lens, quantified by means of a transmittance function, are characterized by measuring and analyzing the line widths or critical dimensions of aerial images formed by the test targets.

Figure 2A:
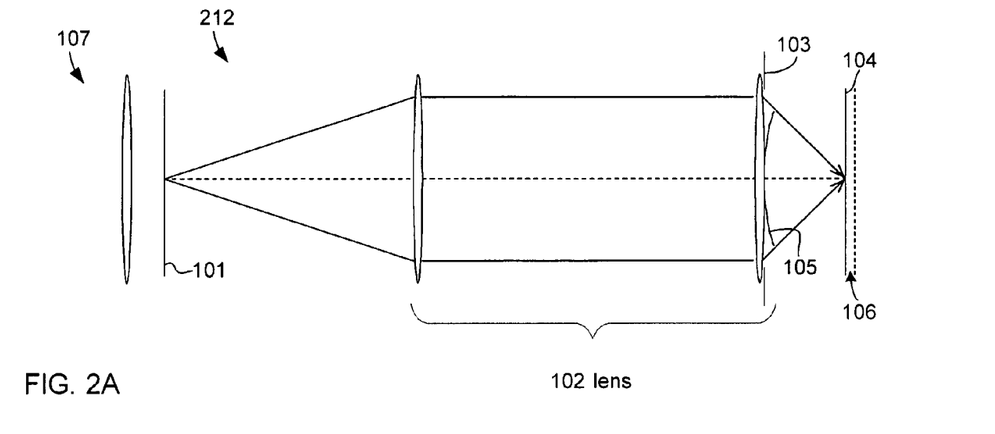
FIG. 2A is a schematic drawing of a projection lithography system.

FIG. 2 is a schematic drawing of the imaging system 212 for projection lithography. Although the imaging system 212 is schematically shown to have refractive elements, this invention is equally applicable to imaging systems having all reflective elements or imaging systems having a combination of reflective and refractive elements. Imperfections of a projection lens can be characterized by a transmittance function. The transmittance function is the ratio of two electromagnetic wave amplitudes, $a/a_0$, that will be defined shortly. Consider a Gaussian electromagnetic beam that issues from a point on the photomask, travels through the imperfect imaging lens, and arrives at a point (x, y) at the image plane (the wafer) 104. The Gaussian beam is focused at a point (x, y) in the image field, and at its conjugate point on the photomask. The Gaussian beam is approximately a plane wave, having a direction of propagation that can be parameterized by two angular variables: (θ, φ). The Gaussian beam has a complex amplitude a, having a phase and a magnitude, at the image plane. The amplitude $a_0$ is the amplitude the Gaussian beam would have if the lens were perfect. Consequently, the transmittance function, $a/a_0$, has a phase and a magnitude. By definition, the transmittance function takes the constant value 1 for a perfect lens. The phase of the transmittance function, known as the wave front error or aberration, is proportional to the optical path error; i.e. a propagation-time delay or gain, associated by the path taken by said beam. The magnitude of the transmittance function indicates a difference in light attenuation associated by the path taken by the beam. The cause of the attenuation can be absorption or scattering in the lens material, scattering of light by surface roughness at the interfaces of optical elements, and angle-dependent partial reflection and transmission at lens interfaces. The transmittance function depends on four independent variables: two angular variables (θ, φ) that indicate the direction of propagation of said electromagnetic wave; and two (x, y) coordinates to indicate the point in the image field. The direction of propagation (θ, φ) can be mapped onto the exit pupil sphere 105 of the imaging system 102. For a realistic imaging system, the phase and amplitude of the transmittance function is non-uniform (not constant-valued).

Before considering the preferred embodiments of the present invention in greater detail, it may be beneficial to briefly review the state of art with reference to characterizing imperfections in an imaging system used in projection lithography.

Numerous interferometric techniques are available to measure and map wave front aberrations of a projection lens at the time it is manufactured. Although using interferometric techniques in an assembled and operating lithography instrument is more restrictive, such techniques have been developed Examples of interferometric techniques and systems may be found in U.S. Pat. Nos. 5,978,085, 6,356,345, 6,573,986, 6,650,399 and the following publications:

1) N. R. Farrar, A. L. Smith, D. Busath, D. Taitano, entitled "In-situ measurement of lens aberrations," (SPIE, Vol. 4000, p. 18, 2000) hereinafter called the Farrar et al. publication;

2) M. V. D. Kerkhof, W. d. Boeij, H. Kok, M. Silova, J. Baselmans, and M. Hemerik, entitled "Full optical column characterization of DUV lithographic projection tools," (SPIE, vol. 5377, pp. 1960-1970, 2004); and 3) H. Medecki, E. Tejnil, K. A. Goldberg, and J. Bokor, entitled "Phase-shifting point diffraction interferometer," (Optics Letters, Vol. 21, No. 19, 1996) hereinafter called the Medecki et al. publication.

The Farrar et al. publication for example, proposes an interferometric method to characterize aberrations of a lithography projector. This method however, requires a non-standard, therefore costly, three-layer reticle.

In the Medecki et al. publication, an interferometry technique is used to measure the wave front aberrations of a lithography projector in-situ. This method requires using a photomask, another reticle at the wafer (image plane), and detecting an image behind the image plane at considerable defocus. Such a measurement requires special access and modifications to the projection lithography tool, which is not feasible without technical support of the manufacturer of the lithography projector.

Other examples may be found in U.S. Pat. Nos. 6,011,611; 6,130,747; 6,674,511; and 6,741,327.

In the U.S. Pat. No. 6,674,511 it is proposed to measure the even-type aberrations from the lateral position shift (registration) of the diffracted images of asymmetric periodic line patterns.

In U.S. Pat. No. 6,741,327, periodic line structures (pairwise wiggling lines as shown in FIG. 2) are used for aberration correction (especially for chromatic aberrations). In this disclosure, the difference between the right and the left line patterns in width is to be minimized.

Periodic line patterns are used for measuring the aberrations in U.S. Pat. No. 6,130,747. The period satisfies certain conditions related to the illumination so that the first-order diffracted light from the test pattern is completely inside the lens pupil and the third-order diffracted light is completely outside the lens pupil. Line structures with equal line widths (U.S. Pat. No. 6,011,611) or with a thick line width and a thin line width (U.S. Pat. No. 6,130,747) are proposed as aberration measuring marks on the reticle (mask).

The above-mentioned prior art documents describe methods of using line structures which are different from the preferred embodiment of the present invention in the following respects. First, in the preferred embodiment of the present invention, a chirped line/space structure in which the line or space widths keep varying is disclosed. Second, the preferred embodiment of the present invention can be utilized to measure both phase aberration and amplitude attenuation of an imaging system. In short then, as noted earlier, a chirp line grating is a generalized line grating having at least 3 lines and 2 spaces, wherein a reciprocal of the pitches (reciprocal of the sum of the widths of a line and a space adjacent to the line) are substantially uniform in the spatial frequency domain. In the preferred embodiment of the present invention, sets of such chirp line gratings are disclosed in the same orientation and at different orientations for measuring the amplitude. The prior art discloses techniques for only phase aberration measurements.

Other prior art documents that are of interest and relevance include:

1). P. E. Dirksen, J. Braat, A. J. E. M. Janssen, C. Juffermans, "Aberration retrieval using the extended Nijboer-Zernike approach," J. Microlith. Microfab., Microsyst., Vol. 2, p. 61, 2003, hereinafter called the Dirksen article;
2). P. Dirksen, C. Juffermans, R. Pellens, M. Maenhoudt, and P. De Bisschop, "Novel aberration monitor for optical lithography," SPIE, vol. 3679, pp. 77-86, 1999; J. Sung, M. Pitchumani, hereinafter called the Dirksen et al. article, and
3). E. G. Johnson, "Aberration measurement of photolithographic lenses by use of hybrid diffractive photomasks," Applied Optics Vol. 42, No. 11, 2003.

In U.S. Pat. No. 6,317,198 a test mask with pinhole grating structures is disclosed.

The 1999 and 2003 articles by Dirksen et al. disclose an extended Nijboer-Zernike (ENZ) approach to measure both phase and amplitude transmittance functions of lithographic projection lenses and other imaging systems. This method is based on scanning electron microscope (SEM) measurement of intensity point spread function of the lens, which was printed in photoresist (PR) patterns on a wafer. The ENZ analytical method is used to extract both phase and amplitude errors. However, the accuracy of the measurement is limited to on the order of 10 milli-waves and is only sensitive to the lower order aberrations.

Considering now the preferred embodiment of the present invention in greater detail with reference to FIG. 2A, there is illustrated a schematic drawing of a projection lithography system 212. In the preferred embodiment of the present invention a method is disclosed to measure the aberration and attenuation maps of the lens system 102 (FIG. 2A) in the projection lithography system 212. The method uses a test mask (reticle) indicated generally at 101, and forms an image on a substrate surface or an image detector surface, whichever may be the case, designated in general as an image plane 104. As will be explained hereinafter in greater detail, the lens transmittance functions are extracted from a measured image, which is compared with a simulated image using nominal transmittance functions. The lens system 102 can have a plurality of lenses or mirrors. The exit pupil plane 103 of the imaging lens system 102 is conjugate to the illumination pupil plane of the illumination optics 107 when the mask is clear, meaning a point on one plane is imaged onto a point on the other plane. This will be described in more detail later.

Figure 2B:
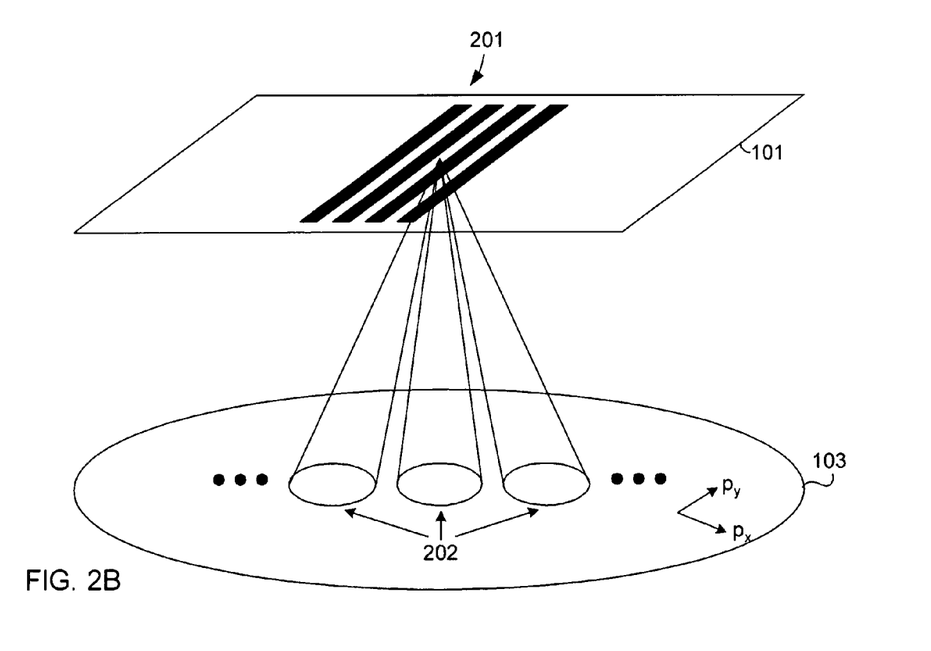
FIG. 2B is a schematic drawing of diffraction of light by a grating on a photomask.

Referring now to FIG. 2B, for a one-dimensional line structure 201 disposed on the mask 101, diffracted light beams 202 spread on a lens pupil plane 103. Although in FIG. 2B, the light beams 202 are shown spread apart, the light beams 202 may overlap with one another. For periodic structures, the diffraction beams 202 are discrete as shown in FIG. 2B.

For understanding the preferred embodiment of the present invention, a light wave function $I(p_x, p_y)$ is defined. In this regard, the light wave function, given by $I(p_x, p_y)$, is indicative of the phase and amplitude distribution of the incident light beams 202 on the lens pupil plane 103. The terms $p_x$ and $p_y$ define a coordinate location $(p_x, p_y)$ on the lens pupil plane 103, and a transmitted light wave, defined by $T(p_x, p_y)$, is the product of the incident light wave and the complex lens pupil function $\Theta(p_x, p_y)$, where $T(p_x, p_y)$ is zero outside the regions of the diffracted light beam.

The complex lens transmittance function is sampled (and weighted by the light beam intensities) only over the regions illuminated by the diffracted light beams when forming the image on the image plane 104. Therefore, the information of lens aberration and attenuation is coupled in the diffraction image formed on plane 104, and can be extracted by measuring and analyzing the diffraction image.

Figure 3A:
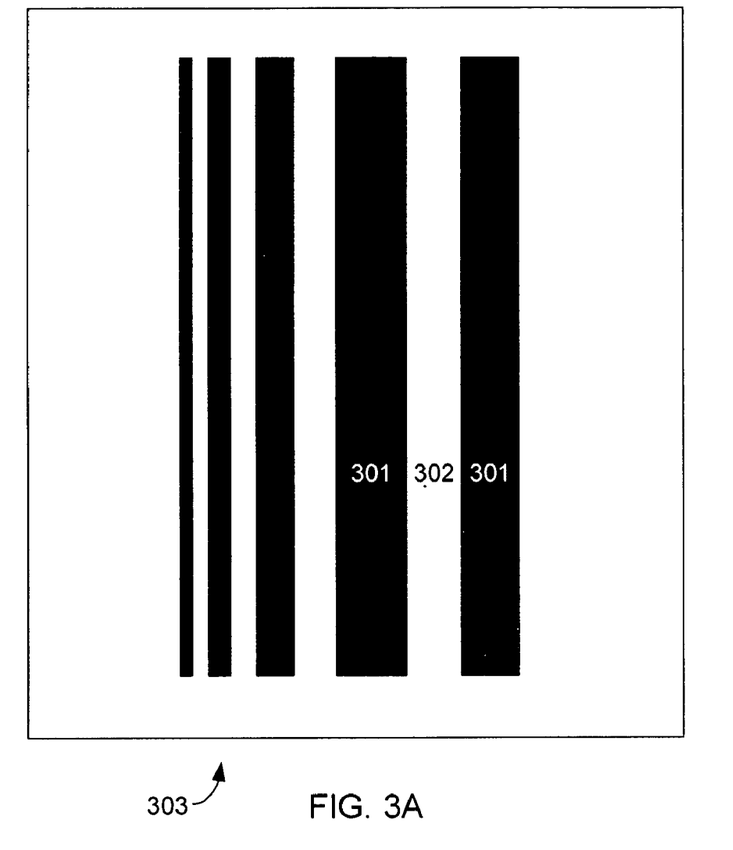
FIG. 3A-B illustrates a test structure on a test mask for phase and amplitude transmittance function measurements of the projection lithography system of FIG. 2.
Figure 3B:
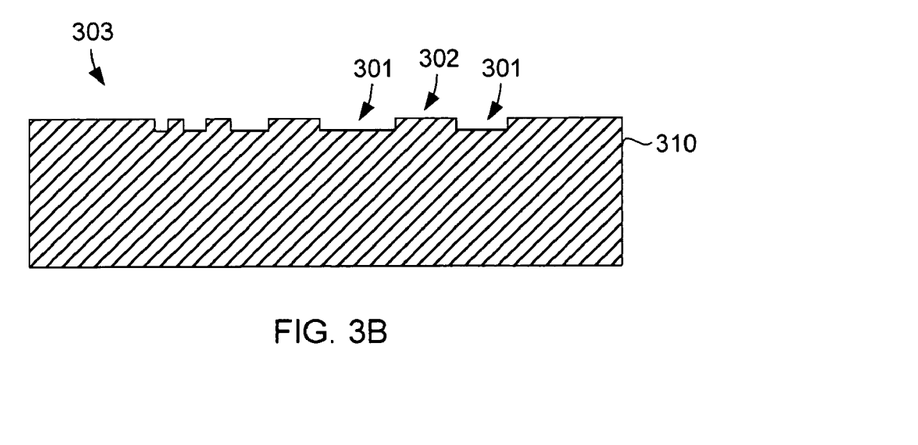

In the preferred embodiment of the present invention, a test mask has line structures with varying line/space widths as illustrated in FIG. 3A, which is a top-plan view of a test structure 303. FIG. 3B provides a cross-sectional view of the test structure 303 on a substrate 310. In a preferred test structure, such as the shown test structure 303, the test structure includes phase-shifted structures, where 301 illustrate the phase-shifted areas of the reticle and 302 illustrate the un-shifted areas. Light waves diverted from different parts of the chirp line/space structure form different sampling areas on the lens pupil 103, such as the beams 202 illustrated in FIG. 2B. Therefore, the diffraction image carries information of lens transmittance at different positions on the lens pupil.

Figure 4:
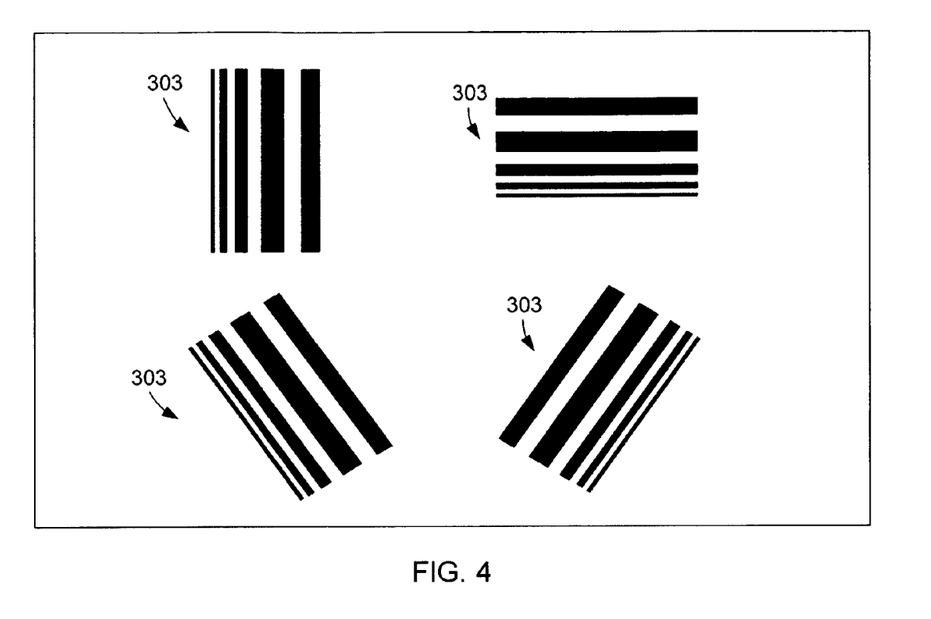
FIG. 4 illustrates a photomask having test structures oriented at different angles.

The test structure 303 as disposed on substrate 310 as best seen in FIG. 3A is a single test structure that has only 5 lines. It should be understood that this is an illustrative example only and that a single test structure with a greater number of lines or a lesser number of lines is clearly contemplated by the present invention. Moreover, it should be understood that multiple test structures are also clearly contemplated by the present invention. In such a case, multiple test structures 303 with different line/space width configurations form different sampling areas 202 on the lens pupil plane 103, and enable more detailed and accurate extraction of the lens transmittance function. Each test structure 303 may also have a unique orientation on the mask as compared to the other test structures 303 in order to generate sampling areas 202 of light beams on the pupil at different orientations. FIG. 4 illustrates a set of like test structures 303 in different orientations. Although FIG. 4 illustrates four different orientations, there can be a lesser number of orientation configurations and a greater number of orientation configurations.

Considering now the line/space structures in greater detail, the periods ($L_1, L_2, \ldots, L_n$) of the line/space structure varies inside the test structure 303. The corresponding wave vectors, $\vec{k}_1, \vec{k}_2, \ldots, \vec{k}_n$, are related to the periods as $$\vec{k}_i = \frac{2\pi}{L_i}\hat{x} + \vec{k}_0 \qquad (1)$$

where $\hat{x}$ is a unit vector of the direction perpendicular to the lines, and $\vec{k}_0$ is the incident wave vector of the illumination light. In the preferred embodiment, the wave vectors $\vec{k}_i$ are evenly distributed on the spatial frequency domain. Therefore, the diffracted light wave from different parts of the test structure 303 propagates through different parts of the lens pupil 103, enabling maximum sampling on the lens pupil plane 103.

The illumination of the lithography instrument also has an effect on the sensitivity of the lens transmittance measurement. The illuminator has a pupil. The optical field in the pupil of the illuminator is substantially the Fourier transform of the illumination that is incident on the photomask. The distribution of light intensity in the pupil of the illuminator is adjustable and it is a carefully controlled parameter of optical lithography. The pupil of the illuminator and the pupil of the projection lens are conjugate to each other when the photomask is clear. When reference is made to the distribution of the illumination in the pupil, the reference will be made without distinguishing whether it is the pupil of the illuminator or the pupil of the projector, since the two pupils are conjugate to one another. The illumination typically under fills the pupil of the projector. The distribution of illumination in the pupil will be synonymously called pupil-fill or illumination configuration. Pupil-fill controls partial coherence of the illumination at the object (photomask) plane. Smaller pupil fill results in higher coherence at the photomask.

Figure 5A:
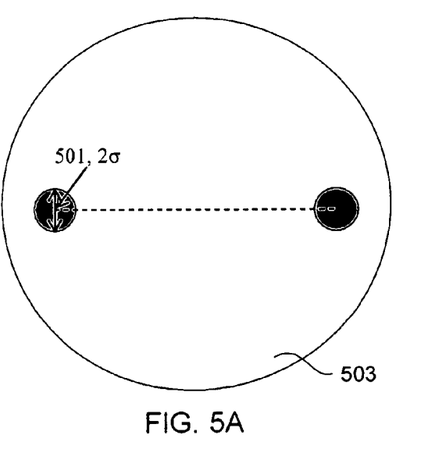
FIG. 5A-B is a schematic drawing of dipole illumination.
Figure 5B:
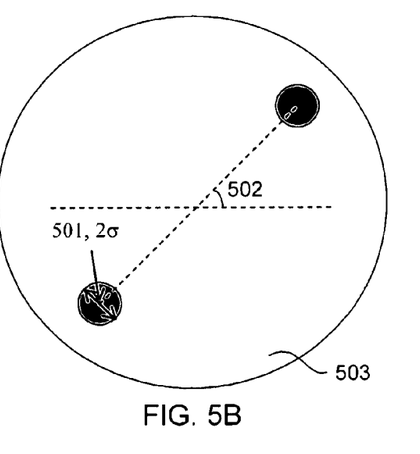

A partial coherence factor σ (501 is 2σ as shown in FIG. 5A-B), which is a measure of the physical extent (radius) of the light source in the pupil of the illuminator, is defined as the ratio of the incident illumination numerical aperture to the imaging lens numerical aperture. To form the images of test structures on the image plane (or the substrate level), it is preferred that the σ is small. Small σ provides sharper sampling areas or spots 202 of the diffracted light on the lens pupil plane. The preferred embodiment uses dipole illumination 503 with σ<0.2 at one or several orientations (different angles 502) as illustrated in FIG. 5A-B. The dipole illumination has high resolution for printing the line/space test structures. However, other illuminations can also serve in this invention, for example, a circular illumination with σ<0.4.

The diffracted images from the test structures can be recorded by a photo sensitive layer on the substrate or by an image detector. The preferred method uses a scanning electronic microscope (SEM) to scan the developed photosensitive layer, such as a photoresist layer, because the SEM has higher resolution than any state-of-the-art CCD arrays; and it does not require an additional imaging system to magnify the diffraction images for quality CCD detection. This makes it convenient to characterize an installed exposure system.

The measurement of the diffracted images can be taken at various defocusing positions, such as a defocusing position 106 as best seen in FIG. 2A. For measurements using photoresist exposure processes, the dose conditions can also be changed to provide more information of lens transmittance function in the measurements.

The developed photoresist pattern of the recorded image is measured using the SEM or other metrology tools. In the preferred embodiment, the one-dimensional line/space image widths (called critical dimensions, or CD) can be measured using a CD scanning electronic microscope or simply a CD-SEM. A CD-SEM or other metrology tool can have a measurement bias, which may be caused by the image pattern recognition. In most cases, lines with similar line widths have close measurement bias, and so do the spaces (negative lines). Therefore, using a differential critical dimension measurement is preferred in order to eliminate the metrology bias. Moreover, a SEM or other metrology tool can have its own effects on image distortion, so such tools should be calibrated properly. For example, periodic grids with known periods at x- and y-directions can be used to calibrate the distortion from the metrology tool itself.

In the preferred embodiment, the background on the test mask, i.e. the region in between and around the test structures, is covered by an opaque material, such as chrome, for photomasks that operate in the transmission mode. In the reflection mode, the background is a non reflecting material. With this dark background, a micro-stepping technique can be applied to reduce the impact of across wafer variation of CD measurements. For example, see U.S. patent application Ser. No. 10/971350, by F. Zach, B. Wu, and A. Sezginer, entitled "Method for Reducing the Impact of Across Wafer Variation of CD Measurements," filed Oct. 22, 2004, which patent application is incorporated herein by reference. By applying the micro-stepping technique, the measurement of the complex transmittance function is immune to the inter chip process variations. However, this is not an indispensable requirement in the preferred embodiment of the present invention, especially when the wafer process is uniform and the inter chip process variation is small.

The complex lens transmittance function, Θ, can be represented by the phase Φ and the amplitude A parts:

$$\Theta = A \exp(i\Phi) \qquad (2)$$

The aberration map, Φ, and the attenuation map, A, are functions of two dimensional positions on the lens pupil plane (ρ, θ). They are the phase and amplitude lens transmittance functions. They usually use a series of Zernike polynomials to represent the transmittance functions:

$$\Phi(\rho, \theta) = \sum_{n,m} \sum_{k=1}^{2} \alpha_{nmk} R_n^m(\rho) \begin{Bmatrix} \cos \\ \sin \end{Bmatrix}_k (m\theta) \qquad (3)$$

$$A(\rho, \theta) = \sum_{n,m} \sum_{k=1}^{2} \beta_{nmk} R_n^m(\rho) \begin{Bmatrix} \cos \\ \sin \end{Bmatrix}_k (m\theta)$$

where $R_n^m$ is a Zernike polynomial, $\alpha_{nmk}$ is the Zernike coefficient quantifying the aberration of the system, $\beta_{nmk}$ is the Zernike coefficient quantifying the attenuation of the system, and the index k selects one of the two functions: cosine and sine. Therefore, the phase and amplitude transmittance functions can be represented by:

$$\Phi(\alpha=\{\alpha_{nmk}\}) \text{ and } A(\beta=\{\beta_{nmk}\}). \tag{4}$$

It should be noted that the aberration and attenuation maps can also be represented using other mathematical formula. For instance, the Zernike polynomials, $R_n^m$, in the above equations can be replaced by a universal polynomial $P_n^m$:

$$P_n^m(\rho)=\alpha_{n,m}\rho^n \tag{5}$$

$$\Phi(\rho, \theta) = \sum_{n,m} \sum_{k=1}^{2} \alpha_{nmk} P_n^m(\rho) \begin{Bmatrix} \cos \\ \sin \end{Bmatrix}_k (m\theta) \tag{6}$$

$$A(\rho, \theta) = \sum_{n,m} \sum_{k=1}^{2} \beta_{nmk} P_n^m(\rho) \begin{Bmatrix} \cos \\ \sin \end{Bmatrix}_k (m\theta)$$

The diffraction integral of the point-spread function (transfer function) takes the form shown in the following equation based on M. Born and E. Wolf, "Principles of Optics," (Chapter 9, Pergmon Press, Oxford, UK, 1985):

$$U(x, y) = \tag{7}$$

$$U_0 \int_0^1 \int_0^{2\pi} A(\rho, \theta) \exp\left[ -i\rho^2 f \frac{\pi(NA)^2}{\lambda} + i\Phi(\rho, \theta) + i\rho \frac{2\pi NA}{\lambda} (x\cos\theta + y\sin\theta) \right] \rho d\theta d\rho$$

It should be noted that the point spread function can be derived from more rigorous methods (for instance, using a vectorial diffraction model instead of the scalar model used here) and may not be in the same integral form as in Equation (3). (See, J. J. M. Braat, P. Dirksen, A. J. E. M. Janssen, A. S. van de Nes, "Extended Nijboer-Zernike representation of the vector field in the focal region of an aberrated high-aperture optical system," O.S.A. Journal, vol. 20, pp. 2281-2292, 2003.) The diffraction images can be calculated using Hopkin's representation (see, H. H. Hopkins, "On the Diffraction Theory of Optical Images", Proc. of Royal Soc. Series A., Vol. 217, pp. 408-432, 1953), but other methods can also be used:

$$I(r, f) = \int \int m^*(r-r_1)U^*(r_1, f)J(r_1-r_2)U(r_2, f)m(r-r_2) d^2r_1 d^2r_2 \tag{8}$$

where I is the image intensity, f is a defocus distance, m is the mask transmission function, U is the point spread function in Equation (7), and J is the mutual intensity function, and m(r) is the complex transmission coefficient of the test structure at the point r on the plane of the photomask.

The above-mentioned description includes the special case of a real-valued mask function. Mask function m(r) maps the 2-dimensional surface of the photomask to its complex-valued, local Fresnel transmission or reflection coefficient. The mask function assigns an amplitude and a phase shift to each point r=(x, y) for the test structures on the surface of the photomask.

It should be emphasized once again that the calculation of the diffraction image can use more rigorous method (e.g. a vectorial method) instead of the scalar diffraction theory exemplified above (see A. E. Rosenbluth et al, "Fast Calculation of images for high numerical aperture lithography," Proceedings of SPIE, vol. 5377, pp. 615-628, 2004). The reflection and refraction effects at the interface between the surface on the substrate and the immersion liquid (or air) can also be taken into consideration in the diffraction image calculation, as can the optical interference in the stacked layers (See D. G. Flagello et al, "Theory of high-NA imaging in homogeneous thin films," J. Opt. Soc. Am. A, Vol. 13, pp. 53-64, 1996). Moreover, the polarization influence can also be included in the diffraction image calculation (See M. Totzeck et al, "How to describe polarization influence on imaging," Proceedings SPIE, Vol. 5754, pp. 23-37, 2005).

Figure 6:
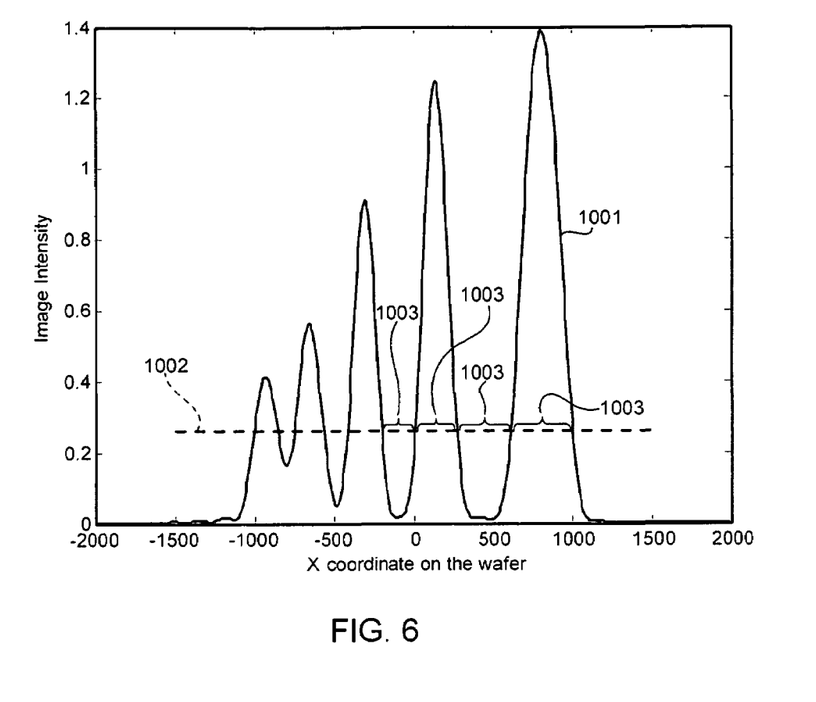
FIG. 6 is an example of image intensity of a test structure on the image plane.

An example of calculated diffraction image 1001 is shown in the graph illustrated in FIG. 6. The x-axis is chosen to be perpendicular to the lines of the test structures. When the diffraction image is recorded in a photo sensitive layer, there is a threshold value 1002, which is the ratio of the dose to clear to the dose exposed. Regions with intensity higher than the threshold would be washed away for positive photoresist. The width of the remaining photoresist (or the washed space) is called CD (critical dimension) 1003, which can be measured using CD metrology tools, for example a CD-SEM. When the exposure dose changes, the threshold changes, as do the CD's of the lines or spaces. It is preferred that the photo sensitive material is exposed to more than one dose value at different locations (preferably next to one another) on the substrate. Measurement of CDs at different doses provides more accurate parameter extraction.

When the defocus distance f changes, so does the diffraction image. It is preferred that the diffraction images are formed and measured at more than one defocus distance.

The measured critical dimensions of the diffracted images of test structures can be compared to the simulated critical dimensions from nominal lens transmittance functions. The Zernike coefficients (or other representation of the complex transmittance function) can be obtained by solving the following optimization problem:

$$\text{Min}_p \left[ \sum_j \sigma_j^2 |measurement_j - simulation_j|^2 \right] = \tag{9}$$

$$\text{Min}_{\alpha,\beta} \left[ \sum_i \sigma_i^2 |CD_{measurement,i} - CD_{simulation,i}|^2 \right]$$

where $\sigma_i$ is a weighting factor for the i-th measurement, and p is the parameters to be extracted ($\alpha$, $\beta$). It should be noted that in one case, only the phase or the amplitude part of the lens transmittance function is measured. In this case, p is $\alpha$ or $\beta$ only. The measurements can be taken from images of different test structures and different process conditions, such as dose and defocus. The position of the photoresist line/space edges can also be measured when a reference mark is provided. They can be measured by a CD-SEM, an overlay metrology tool, or other metrology tools. If the registrations of the photoresist line/space edges, $x_k$, on the substrate can also be measured, the optimization problem can include the registration terms:

$$\text{Min}_p \left[ \sum_j \sigma_j^2 |measurement_j - simulation_j|^2 \right] = \tag{10}$$

-continued $$\underset{p}{\text{Min}}\left[\begin{array}{l}\sum_{j}\sigma_{j}^{2}|CD_{measurement,j}-CD_{simulation,j}|^{2}+\\ \sum_{k}\rho_{k}^{2}|x_{measurement,k}-x_{measurement,k}|^{2}\end{array}\right]$$

where $\rho_k$ is a weighting factor for the kth registration measurement.

In order to eliminate the bias of the metrology tool itself, the measurements can be differences of line widths or the differences of space widths. When using a photodetector to measure the diffraction image, the measurement can also be the whole image profile.

In the preferred embodiment, a nonlinear regression process is used for the above optimization (minimization) process, for example a Gauss-Newton, Levenberg-Marquardt, quasi-Newton, steepest-descent algorithms. (See: P. E. Gill, W. Murray, M. H. Wright, *Practical Optimization*, Chapter 4, Elsevier, 1986), genetic algorithm (See: J. Koza, *Genetic Programming*, MIT Press, Cambridge, Mass., 1992), or simulated annealing (S. Kirkpatrick et al., "Optimization by Annealing," Science, Vol. 220, No. 4598, 1983). The optimization in Equation (9) for parameter extraction can take other forms, for example, $$\underset{p}{\text{Min}}\left[\sum_{j}\sigma_{j}|measurement_{j}-simulation_{j}|\right] \quad (11)$$

or $$\underset{p}{\text{Min}}\left[\underset{j}{\text{Max}}(\sigma_{j}|measurement_{j}-simulation_{j}|)\right]$$

In case the imaging system is close to the perfect case, the complex transmittance function, $\Theta$, is close to 1. Equation (2) can be expanded using Taylor series and only the first term need be retained. The intensity in Equation (8) can be expanded as:

$$I(r,f)=I_0(r,f)+\sum_{n}\Delta p_n\cdot I_n(r,f)$$

where $I_0(r, f)$ is the intensity of the perfect imaging system, $\Delta p_n$ is the change of the n-th parameter, and $I_n(r, f)$ is the intensity change due to the n-th parameter's change for one unit ($\Delta p_n=1$). In this case, a linear regression process can be used to extract the parameters in the lens transmittance function.

The defocus f of the exposure tool can be included in the phase aberration characterization or can be extracted as an additional term in the parameters p to be extracted. The chromatic effects (chromatic aberration) of illumination source can also be extracted as an additional term in the parameters p to be extracted.

In case of using a photoresist layer to record the diffracted images, the photoresist properties, $\gamma$ (such as the diffusion length), can also be extracted from the measurement by including $\gamma$ in the parameters, p.

Figure 7A:
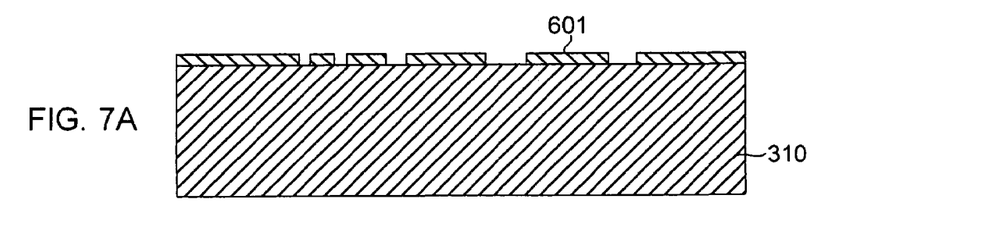
FIG. 7A is a cross-sectional illustration of a photomask having test structures formed on an attenuated phase-shift mask.

Considering now an alternative embodiment of test masks, it will be noted that In addition to the phase shift masks, the test patterns can be fabricated on an attenuated phase shift mask, an alternative phase shift mask, a binary mask, or other types of mask. FIG. 7A is an example of an attenuated phase shift mask with an attenuating (partially opaque) layer 601 on a substrate 310. The partial transmitted layer 601 can be molybdenum silicide or any other suitable material. It allows partial transmission of light at the exposure wavelength, for example 8% transmission, and it also causes a phase shift, for example 180 degrees. For a binary mask, layer 601 can be opaque, for example, it can be a 60 nm to 100 nm thick chrome layer.

Figure 7B:
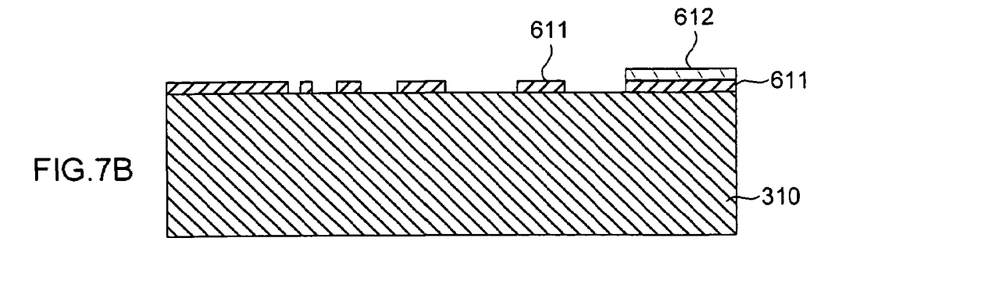
FIG. 7B is a cross-sectional illustration of a photomask test structure formed on a binary or attenuated phase-shift mask.

FIG. 7B illustrates an example of attenuated phase shift mask with some opaque areas. In this structure, layer 611 is attenuating, and layer 612 is opaque.

From the foregoing, it should be understood by those skilled in the art that the measurement sensitivity and the simplicity of mask making process can change in different preferred embodiments of the present invention.

In yet another preferred embodiment of the present invention, the open area of the test mask may not be covered by an opaque material. In this case, the micro-stepping exposure method cannot be applied.

Figure 8A:
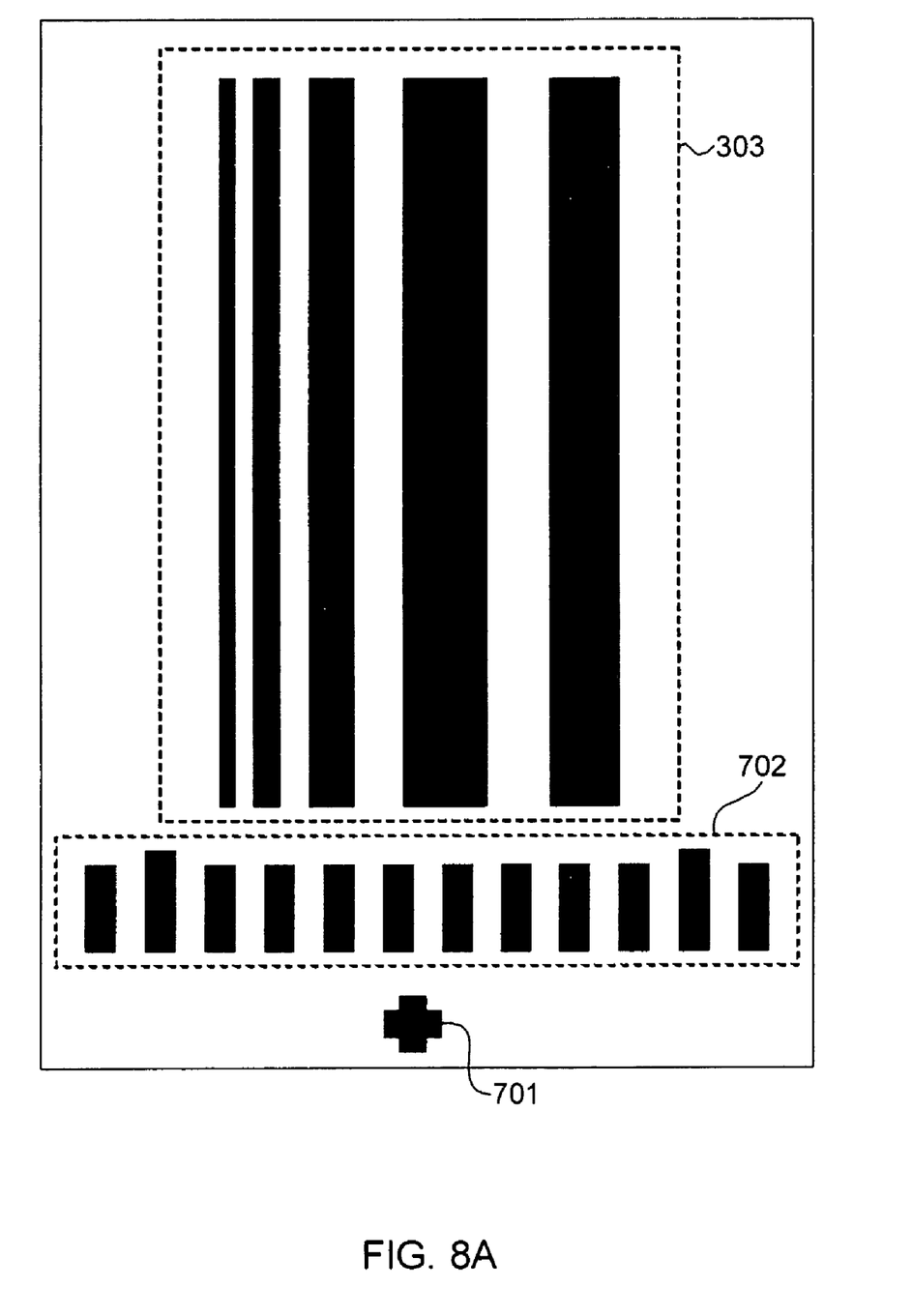
FIG. 8A illustrates a two dimensional profile test structure which includes a ruler for metrology calibration and a mark for image pattern recognition.
Figure 8B:
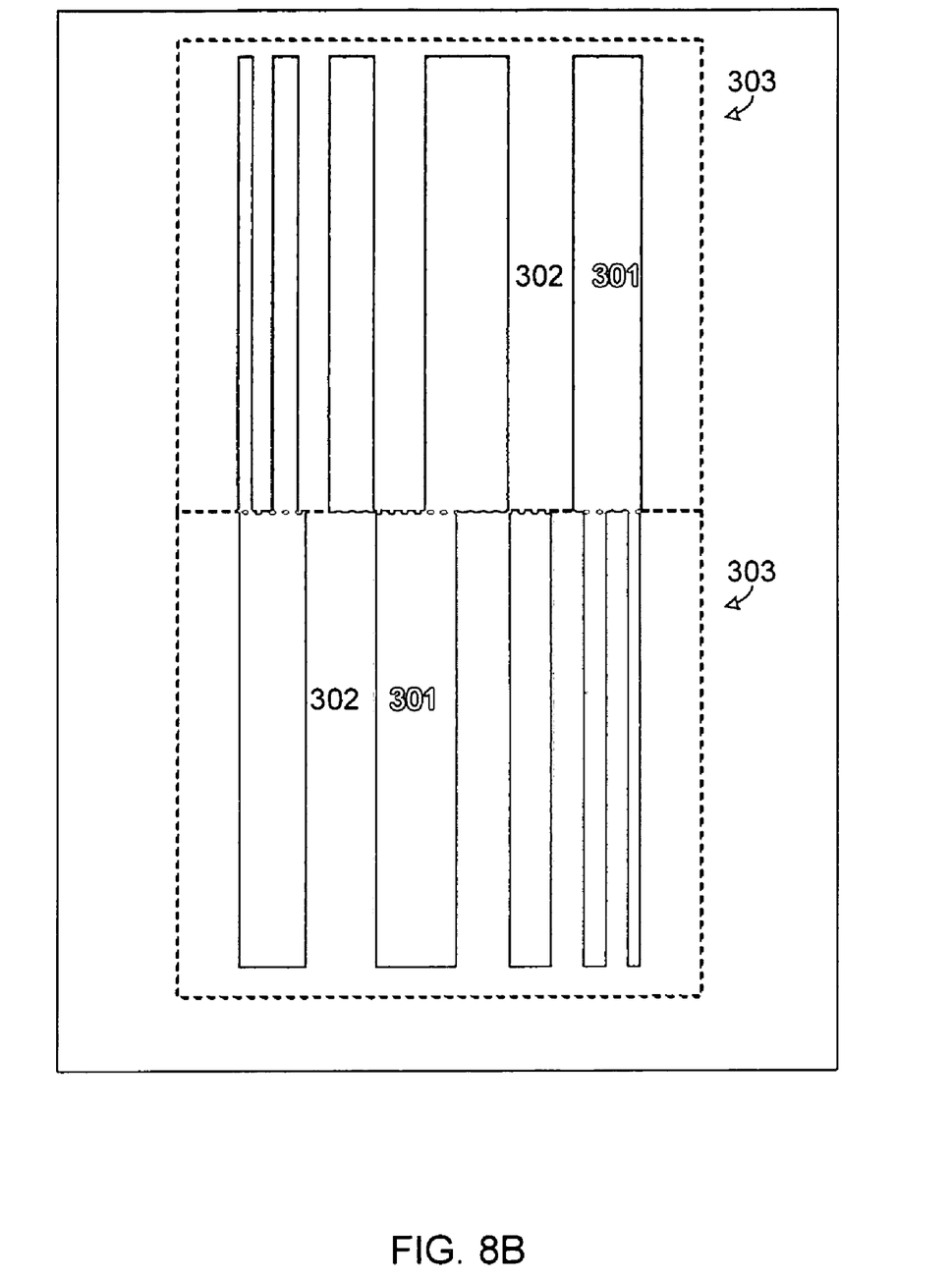
FIG. 8B illustrates a two dimensional profile test structure which includes two line structures in a head-to-head orientation.
Figure 8C:
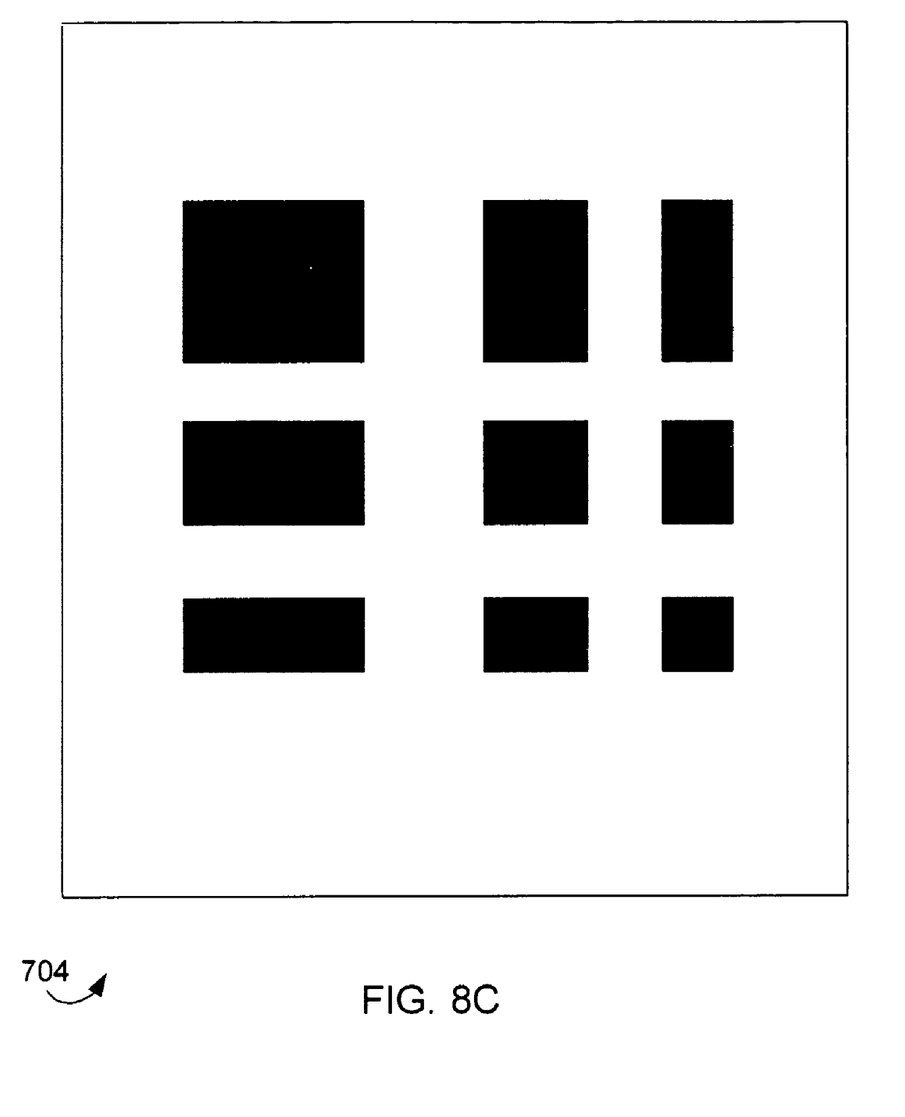
FIG. 8C illustrates a two dimensional profile test structure which is a two dimensional chirp grating.

Another preferred embodiment of the present invention is shown in FIG. 8A-C, where one or more two dimensional structures are added to the chirp line/space structures. For instance, as best seen in FIG. 8A, a mark indicated generally at 701 or a ruler indicated generally at 702 is added for pattern recognition. The ruler 702 can be used for calibration of metrology magnification, or for measuring the registration of a test structure 303. Another example is placing two test structures 303 head-to-head to each other as illustrated in FIG. 8B. The advantage of this type of configuration is that it can reduce the number of SEM measurements and it can provide some registration information (lateral shift) of the lines. Still another alternative embodiment of the test structure is to form a two-dimensional array 704 on a substrate, as illustrated in FIG. 8C. When including two dimensional structures in the test mask, the measurement in Equation (9) to (11) can also be image contours.

In yet another preferred embodiment of the present invention, an illumination configuration uses an additional aperture (in addition to the built-in illumination configuration of the exposure tool of projection lithography). This additional aperture confines the range of angle of incidence of illuminating light on the mask. By doing this, the original partial coherence factor $\sigma$ of the exposure tool is no longer required to be small.

Figure 9A:
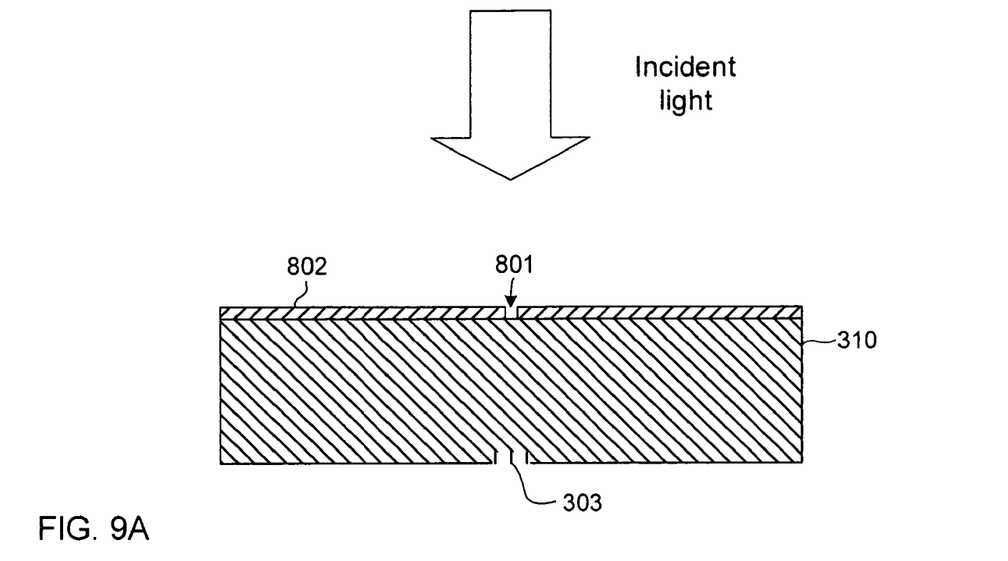
FIGS. 9A-B illustrate alternative embodiments using pinhole apertures for facilitating illumination.

FIG. 9A provides an example of using an additional aperture in the form of a pinhole 801, which is disposed on the backside of the reticle. A non-transmitting coating layer 802, in this instance, can be a chrome layer or other opaque material at the exposure wave length. The test structures 303 are formed on the other side of the reticle (or substrate 310), while illumination light comes from the pinhole side. A disadvantage of this configuration is that the intensity of the incident light on the test pattern is greatly reduced.

Figure 9B:
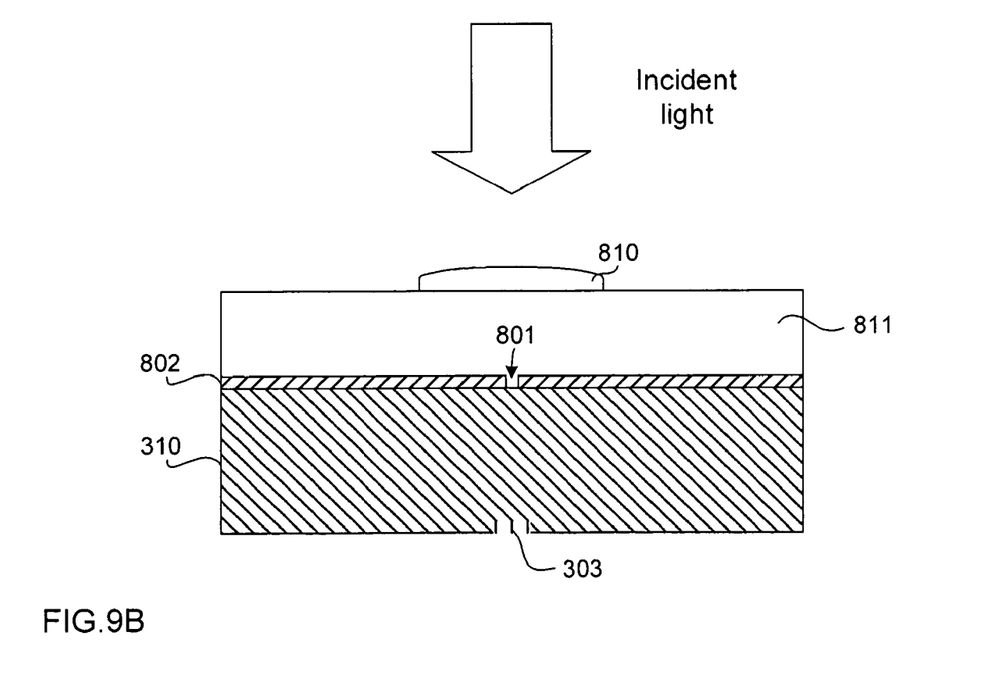

To overcome the above-mentioned problem, an additional focusing lens can be used before pinhole 801. For example, a micro-lens 810 can be formed on a transparent layer 811 as illustrated in FIG. 9B. The micro-lens 810 can be concave lens, a Fresnel zone plate, a holographic lens, or any kind of focusing apparatus. Layer 811 is optional depending on the focus length of the lens.

Considering now the computer program product 70, in greater detail with reference to FIG. 1, the computer program product 70 is a computer usable medium that has encoded thereon computer readable codes. The computer readable codes enable a user, via the characterizing apparatus 10, to characterize the imperfections of an imaging system in a projection lithography tool. In this regard, the computer program product 70 has encoded thereon computer readable program code that causes the computer 30 in one preferred method 1034 to form an image derived from a photomask having a test structure with a chirp grating with non-periodic line/space arrangements and to then extract a lens transmittance function from a measurement of the formed image. The computer readable program code permits the test structure and chirp grating to be varied so that different configurations are available including the following:

1) a photomask with at least two test structures where the test structures have different line and space width configurations with respect to one another;

2) a photomask with a generalized chirp line grating that has a plurality of pitches evenly distributed on a space frequency domain;

3) a photomask with a ruler disposed adjacent to a test structure, where the ruler has equal periods and the test structure has line and space configurations in non repeating patterns;

4) a photomask with a test structure surrounded by a non-transmitting area;

5) a photomask with a phase-shifted test structure;

6) a photomask with an attenuated test structure;

7) a photomask with a binary test structure.

In the preferred embodiment, the computer readable code has been described as being encoded on a disc 70 that can be entered into the computer memory 40 by the disc drive 22, which reads and transfers the code under computer control. However, it is contemplated that the code could be entered remotely from another computer, through a high speed cable or satellite connection, or directly from or any other input device that is capable of communication with the computer 30. Therefore, while a particular embodiment of the present invention has been disclosed, it is to be understood that various different modifications are possible and are contemplated within the true spirit and scope of the appended claims. There is no intention, therefore, of limitations to the exact abstract or disclosure herein presented.

We claim:

1. A method to characterize the imperfections of an imaging system in a projection lithography tool, comprising
   providing a mask having at least one test structure with a generalized line-grating having a plurality of pitches evenly distributed on a spatial-frequency domain;
   forming an image of the at least one test structure through the imaging system;
   measuring the formed image; and
   extracting a complex lens transmittance function in response to said step of measuring.

2. The method according to claim 1, wherein said mask has a plurality of test structures, wherein at least two of said test structures have different line and space width configurations with respect to one another.

3. The method according to claim 1, wherein said generalized line-grating is a two-dimensional structure.

4. The method according to claim 1, wherein said mask includes a ruler having equal periods.

5. The method according to claim 1, wherein a dark background surrounds said test structure for a transmissive type of mask, or a transparent background surrounds said test structure for a reflective type of mask.

6. The method according to claim 1, wherein said at least one test structure is a phase-shifted test structure.

7. The method according to claim 1, wherein said at least one test structure is an attenuated test structure.

8. The method according to claim 1, wherein said at least one test structure is a binary test structure.

9. The method according to claim 1, wherein said step of forming an image of the test structure through the imaging system includes utilizing an illumination source with a small pupil fill.

10. The method according to claim 9, wherein said illumination source is dipole illumination.

11. The method according to claim 1, wherein said mask has test structures on one side, and has a pinhole, a microlens, a Fresnel zone plate, or a holographic lens on the other side.

12. The method according to claim 1, wherein said image of the test structure is recorded on a substrate having a photosensitive layer.

13. The method in claim 12, wherein the image of the test structure recorded on said substrate has line widths, wherein the line widths of the recorded image are measured using an electron microscope.

14. The method in claim 12, wherein the image of the test structure recorded on said substrate has line widths, wherein the line widths of the recorded image are measured using an atomic force microscope.

15. The method in claim 12, further comprising:
   etching a pattern formed on said photosensitive layer into said substrate, or into another layer disposed between said substrate and said photosensitive layer; and
   measuring dimensions of the etched pattern.

16. The method according to claim 15, wherein said dimensions are electrically measured.

17. The method according to claim 12, wherein said photosensitive layer is a photoresist, wherein said image is recorded for more than one exposure dose.

18. The method according to claim 1, and wherein said image is recorded at more than one value of defocus.

19. The method according to claim 1, wherein said step of measuring includes using a photodetector.

20. The method according to claim 1, wherein said step of extracting a lens transmittance function includes:
   providing a computational model of image formation with a lens having a given transmittance function;
   finding the lens transmission function for which a norm of differences between said measurements, and corresponding quantities calculated by said computational model, is substantially minimized.

21. The method according to claim 20, wherein said step of finding includes using linear regression.

22. The method according to claim 20, wherein said step of finding includes using nonlinear minimization of said norm of differences.

23. The method according to claim 20, wherein said differences are between measured dimensions and dimensions predicted by said computational model, wherein differences are evaluated at a plurality of locations on the image.

24. The method according to claim 23, wherein and said norm of differences is related to at least one of the following:
   a sum of squares of said plurality of differences;
   a sum of absolute values of said plurality of differences; and
   largest absolute value of said plurality of differences.

25. The method according to claim 20, wherein said simulated set of data and the measurements of said formed image are indicative of any one or more of the following: line and space widths, differences in line and space widths, line edge registration having either position or lateral shift, image contours, or diffraction images.

26. The method according to claim 1, wherein said generalized line-grating includes a plurality of parallel lines and spaces wherein at least two lines have different widths or at least two spaces have different widths.

27. The method according to claim 26, wherein said step of extracting is limited to extracting the amplitude of a lens transmittance function.

28. The method according to claim 1, wherein said generalized line-grating includes a plurality of parallel lines and spaces wherein at least three lines have different width or at least three spaces have different widths.

29. The method according to claim 28, wherein said step of extracting is limited to extracting the phase of a lens transmittance function without measuring its amplitude.

30. A method to characterize the imperfections of an imaging system in a projection lithography tool, comprising:
    using the imaging system to form an image of a test mask structure having at least one generalized line-grating that has a plurality of pitches evenly distributed on a spatial-frequency domain; and
    extracting a complex lens transmittance function from a measured image of said at least one generalized line-grating.

31. A method for measuring the chromatic effects of an illumination system in a projection lithography tool, comprising:
    providing a test structure on a mask with varying line and space width dimensions;
    forming an image of the test structure through the imaging system;
    measuring said image; and
    extracting a chromatic parameter from the image measurements.

* * * * *